(12) United States Patent
Halling et al.

(10) Patent No.: US 6,984,832 B2
(45) Date of Patent: Jan. 10, 2006

(54) BEAM ANGLE CONTROL IN A BATCH ION IMPLANTATION SYSTEM

(75) Inventors: Alfred M. Halling, Wenham, MA (US); Leonard M. Rubin, Peabody, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 41 days.

(21) Appl. No.: 10/825,527

(22) Filed: Apr. 15, 2004

(65) Prior Publication Data
US 2005/0230642 A1   Oct. 20, 2005

(51) Int. Cl.
*H01J 37/304* (2006.01)
*H01J 37/317* (2006.01)

(52) U.S. Cl. .................................. 250/492.21
(58) Field of Classification Search ............ 250/492.21
See application file for complete search history.

(56) References Cited

U.S. PATENT DOCUMENTS

| | | | | |
|---|---|---|---|---|
| 3,778,626 A | * | 12/1973 | Robertson ................. | 250/492.1 |
| 4,276,477 A | * | 6/1981 | Enge ........................... | 250/398 |
| 4,745,287 A | * | 5/1988 | Turner ....................... | 250/492.2 |
| 4,922,106 A | * | 5/1990 | Berrian et al. ........... | 250/492.2 |
| 5,373,164 A | * | 12/1994 | Benveniste ............. | 250/492.21 |
| 5,483,077 A | * | 1/1996 | Glavish ..................... | 250/492.2 |
| 5,998,798 A | | 12/1999 | Halling et al. | |
| 6,514,838 B2 | | 2/2003 | Chan | |
| 6,657,209 B2 | | 12/2003 | Halling | |
| 6,777,695 B2 | * | 8/2004 | Viviani .................. | 250/492.21 |

OTHER PUBLICATIONS

"Beam Incidence Variations in Spinning Disk Ion Implanters", Andy M. Ray and Jerald P. Dykstra, Elsevier Science Publishers B.V., Nuclear Instruments and Methods in Physics Research B55 (North-Holland) 1991, pp. 488-492.

"Across-Wafer Channeling Variations on Batch Implanters: A Graphical Technique to Analyze spinning Disk Systems", Mary A. Jones and Frank Sinclair, Proc. of the 11th Int. Conf., Conference on Ion Implantation Technology, Austin, TX, Jun. 17-21, 1996, 4 pgs.

* cited by examiner

*Primary Examiner*—Jack I. Berman
(74) *Attorney, Agent, or Firm*—Eschweiler & Associates, LLC

(57) ABSTRACT

The present invention includes an angle adjuster that alters the path of an ion beam prior to contacting a target wafer. The path is altered according to a target position on the wafer in one or two dimensions in order to compensate for angle variations inherent in batch ion implantation system. The angle adjuster comprises one or more bending elements that controllably alter the path of the ion beam during ion implantation. As a result, the target wafer can be implanted with a substantially uniform implant angle.

31 Claims, 17 Drawing Sheets

EXEMPLARY CONTROL SIGNAL FOR VARIOUS TARGET POSITIONS

BEAM ANGLE CONTROL IN A BATCH ION IMPLANTATION SYSTEM

FIELD OF THE INVENTION

The present invention relates generally to batch ion implantation systems, and more particularly to a method and system for performing beam angle control in a batch ion implantation system.

BACKGROUND OF THE INVENTION

In the manufacture of semiconductor devices, ion implantation is used to dope semiconductors with impurities. Ion beam implanters are used to treat silicon wafers with an ion beam, in order to produce n or p type extrinsic material doping or to form passivation layers during fabrication of an integrated circuit. When used for doping semiconductors, the ion beam implanter implants a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway is typically evacuated to reduce the probability of ions being deflected from the predetermined beam path as a result of collisions with gas molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway, which will effectively separate ions of different charge-to-mass ratios.

For a batch ion implanter, the ion beam is directed toward an end station that has a number of wafers located around a circumference of a spinning disk or distributed radially in multiple concentric circles. Pads are affixed to the spinning disk at an angle, typically 5 to 10 degrees to the plane of rotation of the disk. The pads hold the wafers in place because of the centrifugal force exerted thereon while the disk is spinning. The ion beam is typically slowly moved across the wafers in a slow scan direction while the wafers pass through the ion beam relatively quickly in a fast scan direction.

However, the tilt of the pads holding the wafers results in a non-uniform ion beam incidence angle that varies according to position of the wafer. The non-uniform ion beam incidence angle can result in undesirable dopant concentrations in a workpiece. In addition, the non-uniform ion beam incidence can cause shadowing artifacts caused by the 3-dimensional photoresist patterns. What is needed are systems and methods that facilitate uniformity in ion beam incidence angles for batch processing systems.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention performs ion beam angle adjustments during ion implantation in order to provide a substantially uniform implant angle across entire wafers in a batch ion implantation system. The beam angle adjustments are performed in order to compensate for angle variations, referred to as the "cone angle effect", inherently present in batch ion implantation systems wherein workpieces or wafers are held on a spinning disk whose axis of rotation is not parallel to the ion beam.

The present invention includes an angle adjuster that alters the path of an ion beam prior to contacting a target wafer. The path is altered according to a target position on the wafer in one or two dimensions. The angle adjuster comprises one or more bending elements that controllably alter the path of the ion beam during ion implantation. As a result, the target wafer can be implanted with a substantially uniform implant angle.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
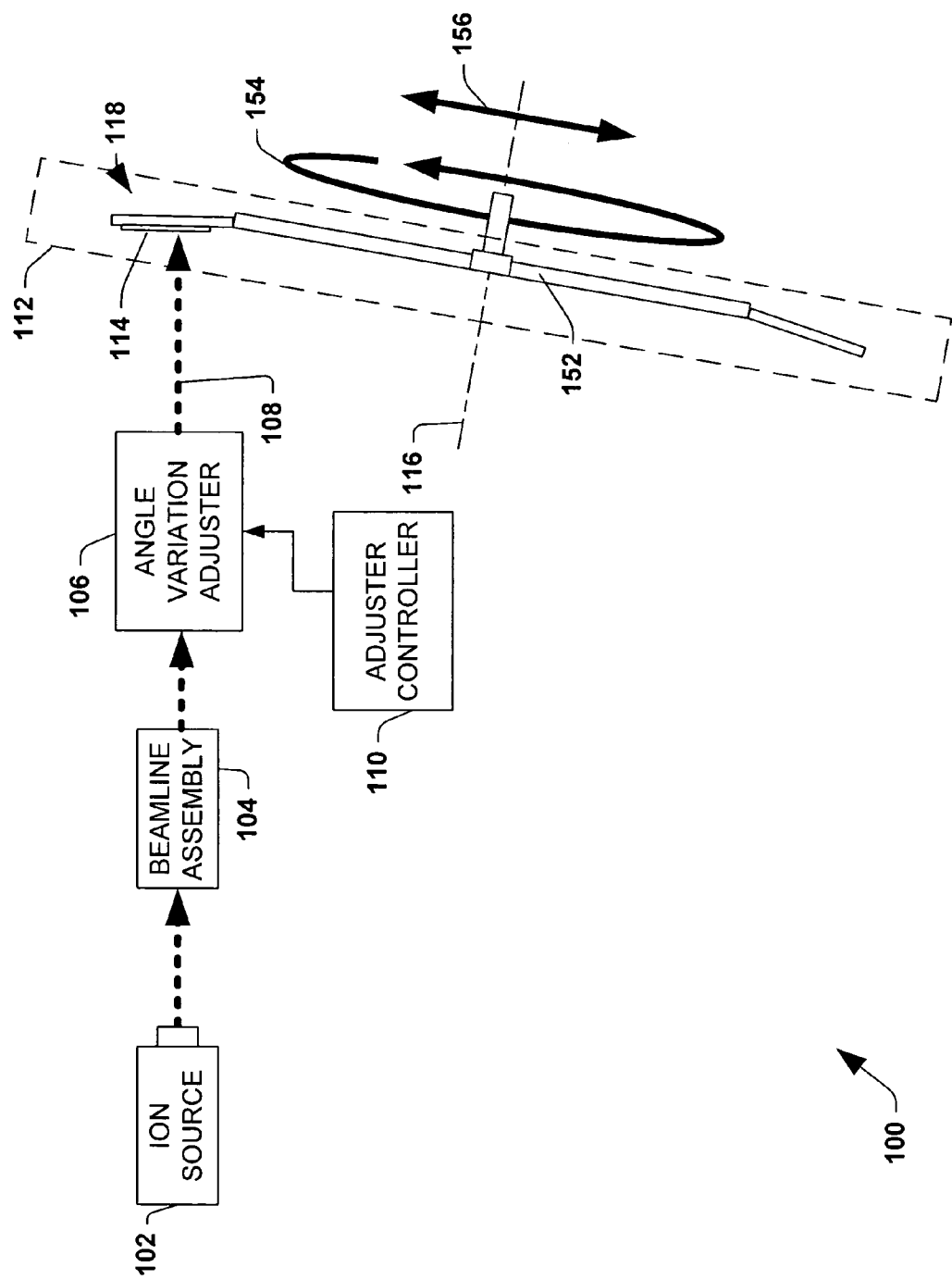
FIG. 1A is a diagram illustrating an ion implantation system with beam angle control in accordance with an aspect of the present invention.

The present invention will now be described with reference to the drawings wherein like reference numerals are used to refer to like elements throughout.

The present invention facilitates ion implantation by compensating incident angles of ion beams during ion implantation processes. Conventional ion implantation systems have variations in the angle of incidence at a target wafer during ion implantation processes due to the "cone angle effect", described below. The present invention employs one or more ion beam bending elements to alter the incident angle seen by target wafer(s) during ion implantation so that various portions of the wafer(s) are implanted by an ion beam with a substantially constant implant angle.

Generally, batch processing ion implantation systems, also referred to as ion implanters, employ a spinning disk or platen in combination with a slow mechanical scan. The disks or platens of such systems employ fingers or pads for support of target wafers and to provide contact cooling. The pads are placed at a pad tilt angle (e.g., between 5 to 10 degrees) to the plane of rotation of the disk and its spin axis in an appropriate relationship to a stationary ion beam. Centrifugal force of the spinning disk holds the wafers in place and provides pressure for contact cooling. The centrifugal force is proportional to the sine of the pad tilt angle. Variations in nominal implant angle are then achieved by positioning the disk and its spin axis at an appropriate relationship to the stationary beam. The nominal implant angle is the angle at which the beam strikes the wafer when the center of the wafer is exposed to the beam. This angular relationship requires two dimensions for its complete specification, similar to how every point on a sphere can be referenced by latitude and longitude.

Channeling is caused when an ion beam enters the crystal of a semiconductor device along a symmetrical direction, and leads to fewer nuclear collisions and increased range. This can cause three different cases of process results, with dependencies on species, energy, and dose. If channeling is different from one region of a wafer to another, the wafer is referred to as being differentially channeled, which has also been referred to as channeling. Differential channeling is undesirable and can lead to sheet resistance and/or contour map non-uniformities of up to 10 percent across the workpiece. If the entire wafer is channeled in the same substantial manner, the wafer is referred to as being uniformly channeled. Uniform channeling results in substantially uniform sheet resistance and substantially uniform contour maps.

In addition to differential channeling, across-wafer variations in the beam angle result in across-wafer variations in dopant shadowing. This occurs because the wafer surface contains various three-dimensional features. Some features are part of the circuit being fabricated; while others are temporary films used to block the implanted ions from reaching the wafer in selected areas. At the edge of a feature, the boundary between a doped and undoped area is a function of the local geometry, the height of the feature, and the angle of the incoming ion beam. Consequently, across-wafer variations in beam angle will cause variations in doping levels near the edges of features. These variations may adversely affect circuit performance.

Conventional batch processing systems result in implant angle variations at portions of a target wafer that vary from a nominal implant angle at a center of the target wafer. Such variations provide for increased potential for differential channeling. One technique for reducing differential channeling is by choosing a nominal implant angle that reduces the differential channeling. However, doing so limits or prevents employing other implant angles that could provide other desirable results, such as superior device operation.

Referring initially to FIG. 1A, a diagram is provided illustrating an ion implantation system 100 with beam angle control in accordance with an aspect of the present invention. The system is operable to adjust beam implant angles to account for variations due to the "cone angle effect". The system 100 includes an ion source 102, a beamline assembly 104, an angle variation adjuster 106, a controller 110, and an end station 112.

The ion source 102 includes an ion source material (not shown) from which the ions are generated and a power source (not shown) that facilitates the production of the ions from the gas. In some aspects of the present invention, the ion source 102 is operable to adjust the dose according to positional information obtained from the controller 110 and/or the end station 112.

The source materials may include an ionizable gas or vaporized source material. Source material in solid form is deposited into a vaporizer which is then injected into a plasma chamber. If a p type extrinsic wafer material is desired, boron (B), gallium (Ga) or indium (In) will be used, for example. Gallium and indium are solid source materials, while boron is injected into the plasma chamber as a gas, typically boron trifluoride ($BF_3$) or diborane ($B_2H_6$), because boron's vapor pressure is too low to result in a usable pressure by simply heating solid boron. If an n type extrinsic material is to be produced suitable source materials include, for example, source gases arsine ($AsH_3$) and phosphine ($PH_3$) and vaporized solid antimony (Sb). Energy is applied from the power source to the source materials to generate positively charged ions in the plasma chamber. It is appreciated that suitable source materials, other than those described above, can be employed in accordance with the present invention.

The produced ions arrive as an ion beam at the beamline assembly 104, which removes undesired ions from the ion beam and accelerates or decelerates the ions to a desired or selected energy level. The beamline assembly 104 typically includes a mass analyzer (not shown) that selectively removes the undesired ions and other particles and a linear accelerator (not shown) that accelerates or decelerates the ions to the selected energy level. However, the present invention contemplates beamline assemblies that do not include a linear accelerator, for example, some high current ion implanters.

The mass analyzer comprising a mass analyzing magnet that causes only those ions having an appropriate mass to charge ratio to pass through the mass analyzer. In addition to desired species of ions, produced ions typically include a proportion of ions having other than the proper atomic mass. Ions having an atomic mass above or below the proper atomic mass are not suitable for implantation. The magnetic field generated by the mass analyzing magnet causes the ions to move in a curved trajectory. The magnetic field is established by mass analyzer control electronics such that only ions having an atomic mass equal to the atomic mass of the desired ion species traverse the curved beam path through the mass analyzer and through the beamline assembly 104.

After passing through the beamline assembly 104, the ion beam is processed by the angle variation adjuster 106, which adjusts or corrects an implant angle of the ion beam according to a control signal received from the controller 110. A resulting ion beam 108 is directed toward a target wafer 114 at the end station 112. The angle variation adjuster includes one or more beam bending elements, each of which is operable to bend the ion beam a variable amount in one axis. If only a single bending element is employed, altering the implant angle also varies position, thereby altering the applied dose. For the single element situation, some form of modification to the dose control is required. In one aspect of the invention, output of the ion source 102 is adjusted as a function of disk rotation angle under control of 110.

The bending elements can be based on electric fields, magnetic fields, and/or combinations thereof. Typically, individual elements comprise a pair of plates across which an electric or magnetic field is generated. The electric or magnetic field alters a path of the ion beam 108 according to an amount of the electric or magnetic field. As a result, the implant angle of the ion beam 108 can be adjusted by controlling the fields generated by the bending elements.

The control signal generated by the controller 110 is based on and is a function of the current implant position on the wafer (e.g., where the ion beam 108 impacts the wafer). The controller 110 may receive positional information from the end station 112 or it may control the position in the end station, and generates the control signal accordingly. In an alternate aspect of the present invention, the controller obtains implant angle information or data from the end station 112 and generates the control signal therefrom.

The end station 112, in one example, includes a disk 152 that rotates about an axis that is not parallel to the ion beam 108 path. Pads, such as the pad 118 which holds the target wafer 114, hold target wafers on the disk, which in turn causes the target wafers to mechanically pass through the ion beam 108. A direction of rotation 154 is implementation dependent. The disk 152 is mechanically moved as indicated at 156 in order to allow the ion beam 108 to completely pass over the target wafers. The rotary motion 154 provides a circular line scan of the ion beam through the target wafers. To cover the whole wafer, the linear motion 156 is provided to the end station 112. A linear encoder and linear drive (not shown), controlled by the linear encoder, are employed to provide the linear motion 156. Additionally, the linear encoder can provide position information to the controller 110, or the controller 110 can determine not only the linear drive position required for proper dosing but also the proper control signal for the angle variation adjuster 106.

Dosage control electronics (not shown) are typically provided for monitoring and controlling the ion dosage received by the target wafers. Operator input to the control electronics can be provided via a user console (not shown).

Figure 1B:
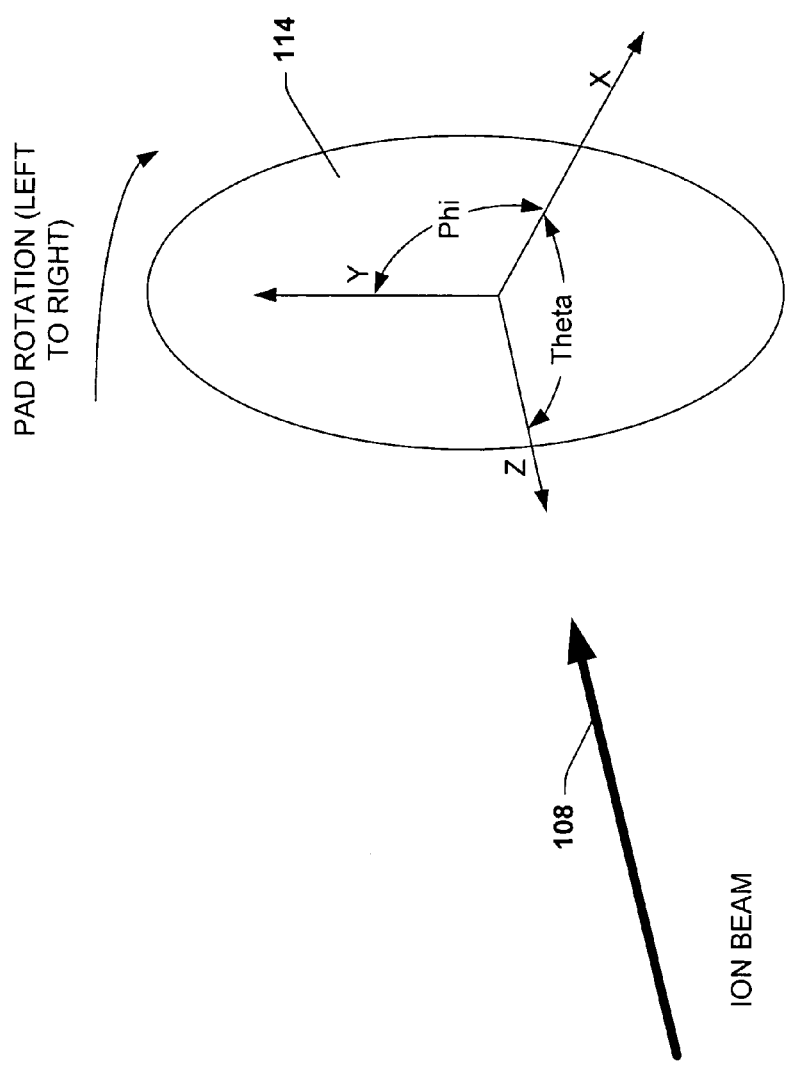
FIG. 1B is a diagram illustrating the ion beam impacting on the target wafer in accordance with an aspect of the invention.

FIG. 1B is a diagram illustrating the ion beam 108 impacting on the target wafer 114 in accordance with an aspect of the invention. An x-axis is generally in a fast scan direction and a y-axis is generally in a slow scan direction, as provided by the linear motion 156 shown in FIG. 1A. The ion beam 108 has a nominal implant angle that is offset from a z-axis. The offset angle can be defined with theta and phi components. According to the present invention, the implant angle of the ion beam 108 is substantially constant for various positions on the target wafer 114 as a result of the angle variation adjuster 106 shown in FIG. 1A. Without adjustments made to the ion beam 108 by the angle variation adjuster 106, the implant angle of the ion beam 108 would be at a nominal value at a line along the y-axis through a center of the wafer and would vary by offset values there from at other positions on the wafer.

Figure 2A:
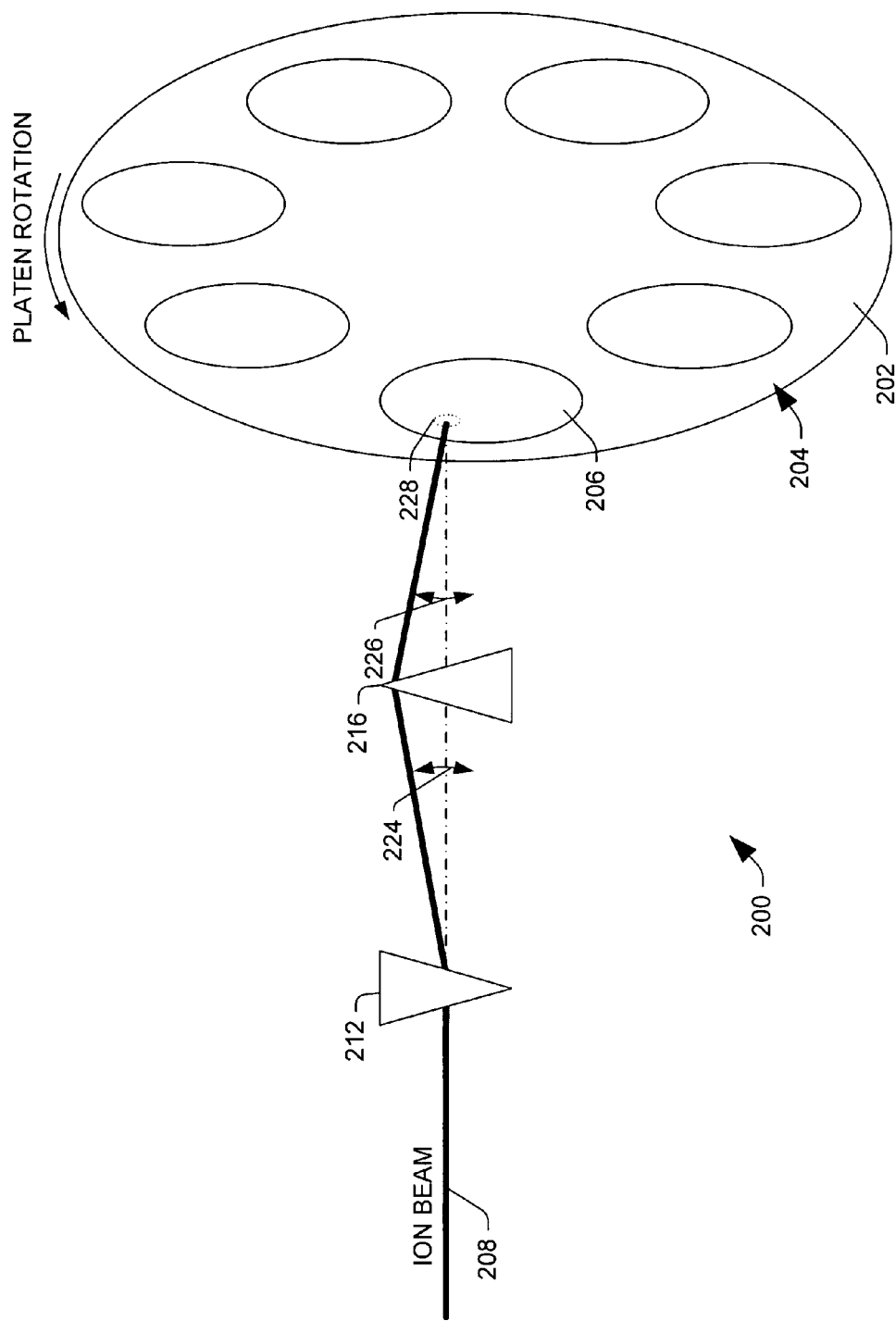
FIG. 2A is a diagram illustrating a dual bending element angle adjuster in accordance with an aspect of the present invention.

FIG. 2A is a diagram illustrating a dual bending element single axis angle adjuster 200 in accordance with an aspect of the present invention. FIG. 2A shows an ion beam 208 aimed at a target portion 228 of a target wafer 206. The adjuster 200 is operable to adjust the implant angle for a single axis, such as a fast scan axis or slow scan axis, according to implant position or spot such that a substantially constant implant angle is achieved across entire wafers. Furthermore, the implant angle adjustment is performed while keeping the beam spot position relatively constant allowing the angle correction to be performed without change to the applied dose.

An ion beam 208 is directed by the dual bending element angle adjuster 200 towards target wafers 204 located on a rotating disk or platen 202. The target wafers 204 are attached to pads (not shown) that are at a tilt angle from the disk 202 so as to hold the target wafers 204 and provide contact cooling via centrifugal force. The ion beam 208 is currently directed at a target wafer 206 and has adjusted an implant angle for the target portion 228 of the target wafer 206.

The angle adjuster 200 includes, in this example, a first bending element 212 and a second bending element 216. The first bending element 212 adjusts a path of the ion beam 208 by a first offset angle in a first direction by the first bending element. The ion beam 208 subsequently travels to the second bending element 216, which alters the path of the ion beam 208 by a second offset angle in a second direction that is opposite the first direction. As a result, the ion beam 208 impacts the same location 228 of the target wafer 206 at a selected implant angle that compensates for the variation in the orientation of the target wafer 206. Although not shown in FIG. 2A, an angle adjuster controller can be present that selects the first offset angle and the second offset angle according to the selected implant angle and a current target position. The angle adjuster controller can also generate control signals to control the bending elements 212 and 216. The angle adjuster controller can be internal or external to the angle adjuster 200 and either configuration is contemplated as falling within the scope of the present invention.

Figure 2B:
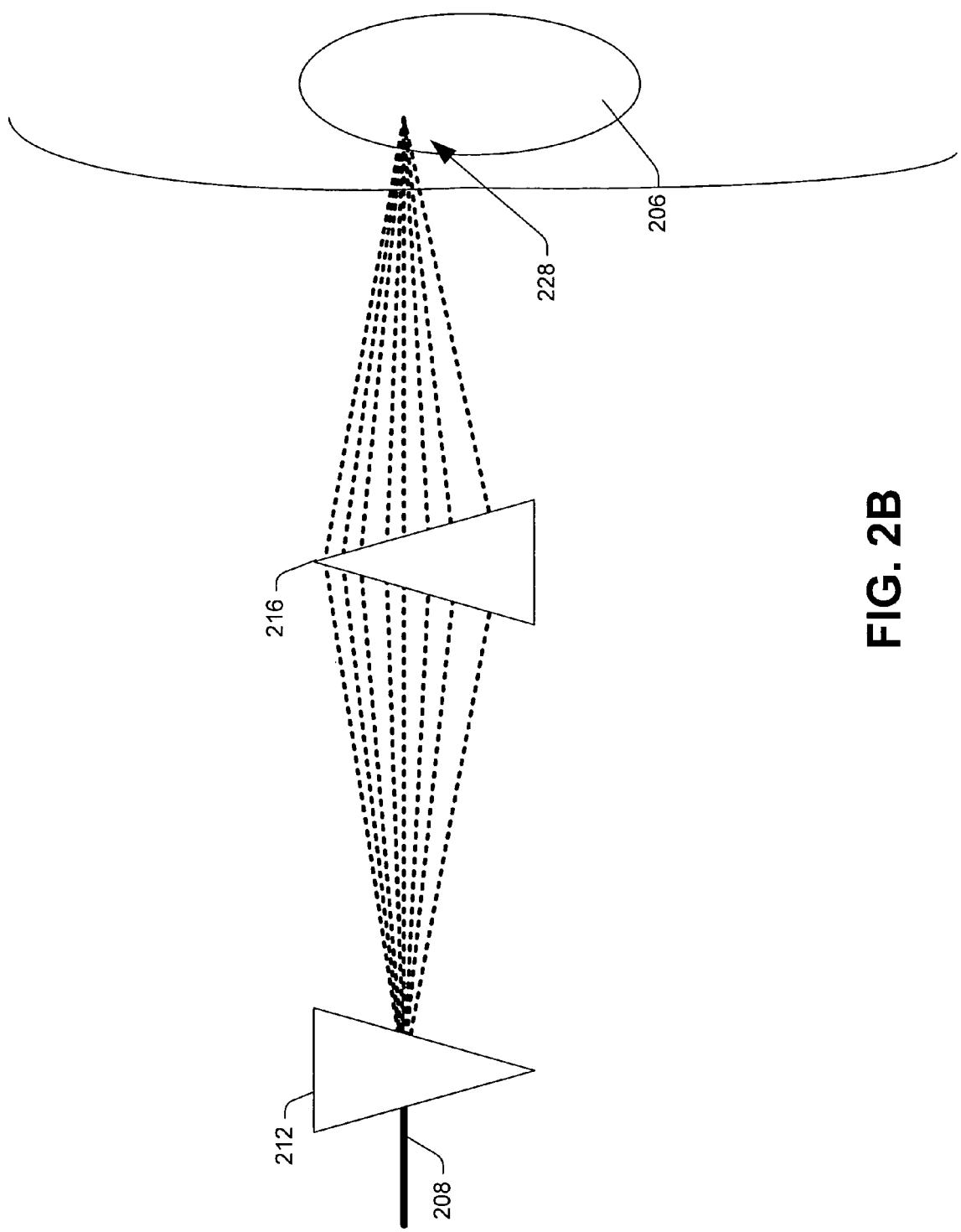
FIG. 2B is a diagram illustrating the dual bending element angle adjuster in accordance with an aspect of the present invention.

FIG. 2B is yet another diagram illustrating the dual bending element angle adjuster 200 of FIG. 2A in accordance with an aspect of the present invention. The view presented by FIG. 2B is a simplified view intended to further illustrate a range of possible angle adjustments and resulting possible paths for a given position on the target wafer 206.

A path of the ion beam 208 can be adjusted according to the first offset angle and a second offset angle to yield a desired or selected offset angle without altering the position at which the ion beam 208 impacts the target wafer.

Figure 2C:
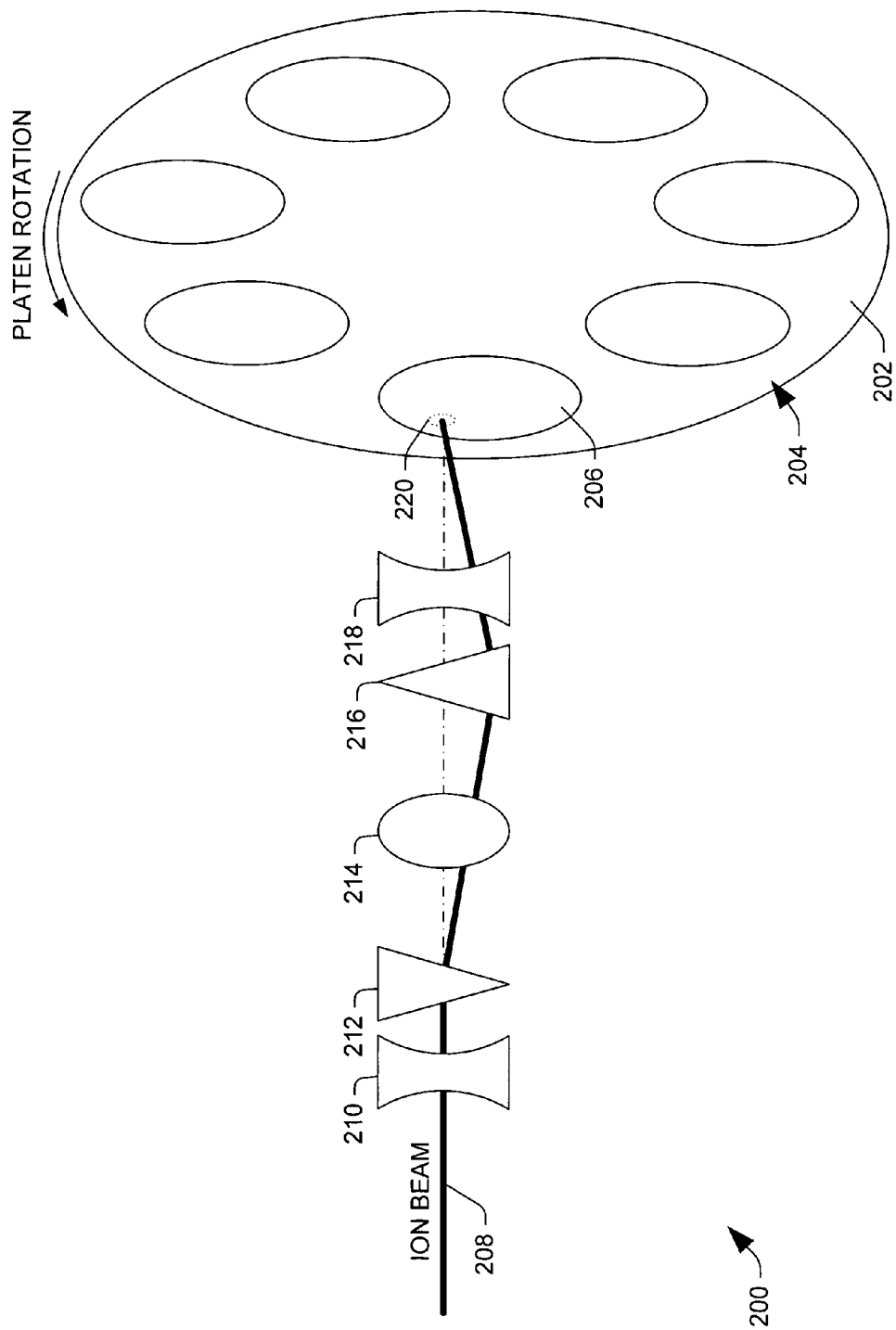
FIG. 2C is another diagram illustrating the dual bending element angle adjuster in accordance with an aspect of the present invention.

FIG. 2C is a diagram illustrating a more general implementation of a dual bending element angle adjuster 200 in accordance with an aspect of the present invention. In this case, adjustable focusing elements are added to preserve the beam size and shape as the path is altered. FIG. 2C depicts the ion beam 208 being aimed at a portion 220 of the target wafer 206. The adjuster 200 is operable to adjust the implant angle for a single axis, such as a fast scan axis or slow scan axis, according to implant position such that a substantially constant implant angle is achieved across entire wafers. The ion beam 208 is currently directed at the target wafer 206 and has adjusted an implant angle for the portion 220 of the target wafer 206.

The angle adjuster 200 includes the first focusing element 210, the first bending element 212, the second focusing element 214, the second bending element 216, and the third focusing element 218. The first focusing element 210 is operable to controllably focus the ion beam, which passes to the first bending element 212. A path of the ion beam 208 is selectively adjusted in the second direction, instead of the first direction as shown in FIG. 2A, by the first bending element and then proceeds to the second focusing element 214. The second focusing element 214 selectively re-focuses the ion beam 208. The ion beam 208 subsequently travels to the second bending element 216, which alters the path of the ion beam 208 in the first direction that is opposite the second direction. As a result, the ion beam 208 impacts the target wafer 206 at a selected implant angle that does not vary substantially by position or portion of the target wafer 206.

Figure 2D:
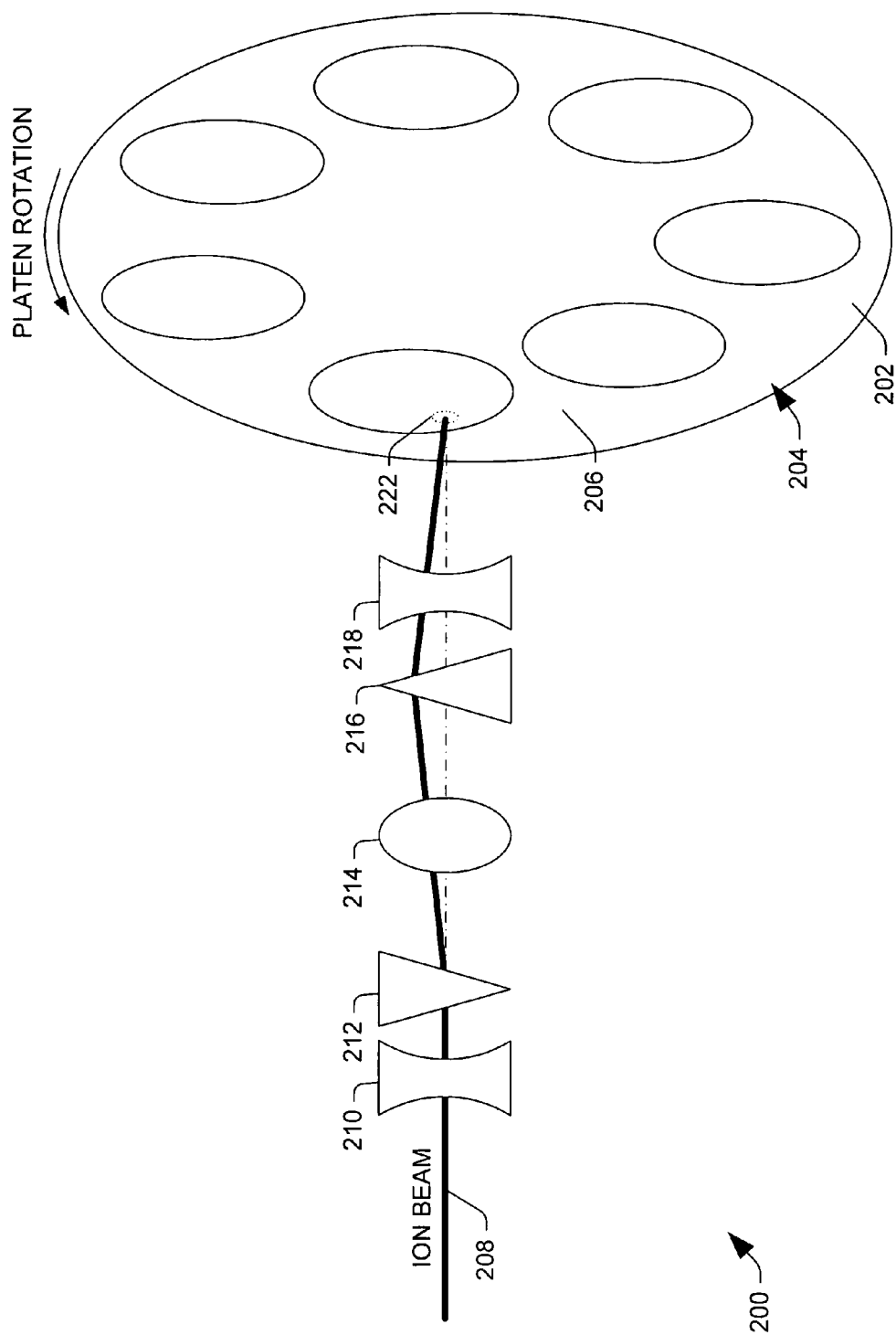
FIG. 2D is yet another diagram illustrating the dual bending element angle adjuster in accordance with an aspect of the present invention.

FIG. 2D is another diagram illustrating the angle adjuster 200 of FIG. 2C in accordance with an aspect of the present invention. In this instance and for illustrative purposes only, the ion beam 208 is directed at another target portion 222 and the angle adjuster 200 adjusts an incidence angle to the target portion 222 in an opposite direction than that of FIG. 2C.

FIGS. 2A to 2D serve to illustrate an exemplary multiple bending element angle adjuster in accordance with the present invention. It is appreciated that variations of the multiple element angle adjuster are permitted, including additional bending elements and/or focusing elements, in accordance with the present invention. In addition, variations with the second bending element 216 replaced by a focusing element that has the same desired steering effect on the beam 208 are permitted in accordance with the present invention. Furthermore, a dual axis angle adjuster of the present invention is contemplated as including two sets of bending and focusing elements that independently adjust a single axis of a path of an ion beam. Additionally, individual bending elements of an angle adjuster in accordance with the present invention can include electric field generation components and/or magnetic field generation components.

Figure 3A:
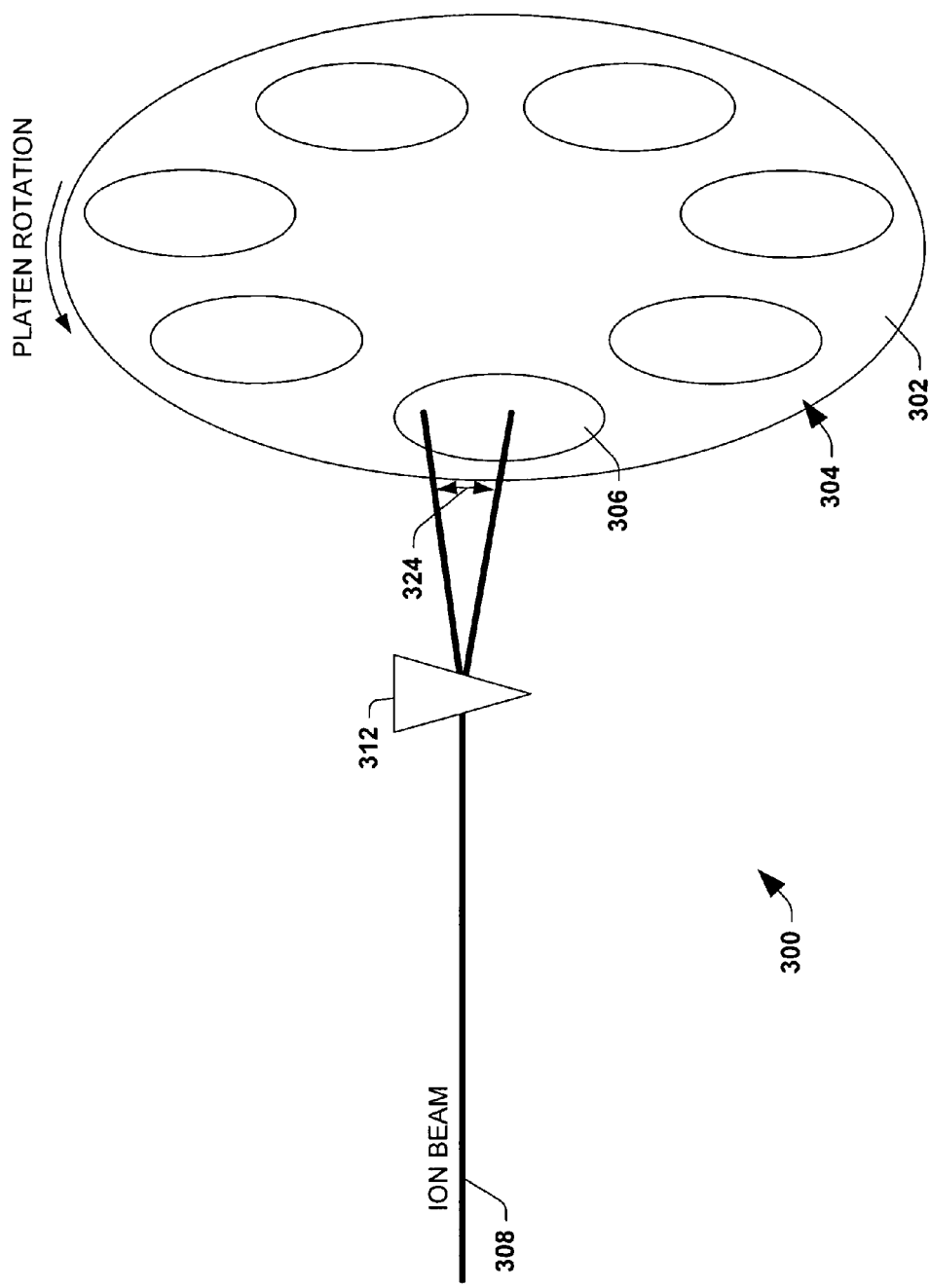
FIG. 3A is a diagram illustrating a single bending element angle adjuster in accordance with an aspect of the present invention.

FIG. 3A is a diagram illustrating a single bending element angle adjuster 300 in accordance with an aspect of the present invention. FIG. 3A depicts an ion beam 308 aimed at various portions of a target wafer 306. The adjuster 300 is operable to adjust the implant angle for a single axis, such as a fast scan axis or slow scan axis, according to implant position such that a substantially constant implant angle is attained across entire wafers.

The angle adjuster 300 includes a single bending element 312 that is operable to bend the ion beam in a first direction throughout a range 324 of possible angle of incidence values. Unlike the angle adjuster 200 of FIG. 2A, the angle adjuster 300 alters a target position on adjusting the angle of incidence. However, the angle adjuster 300 only requires a single bending element to properly operate instead of the two required by the angle adjuster 200 of FIG. 2A.

Figure 3B:
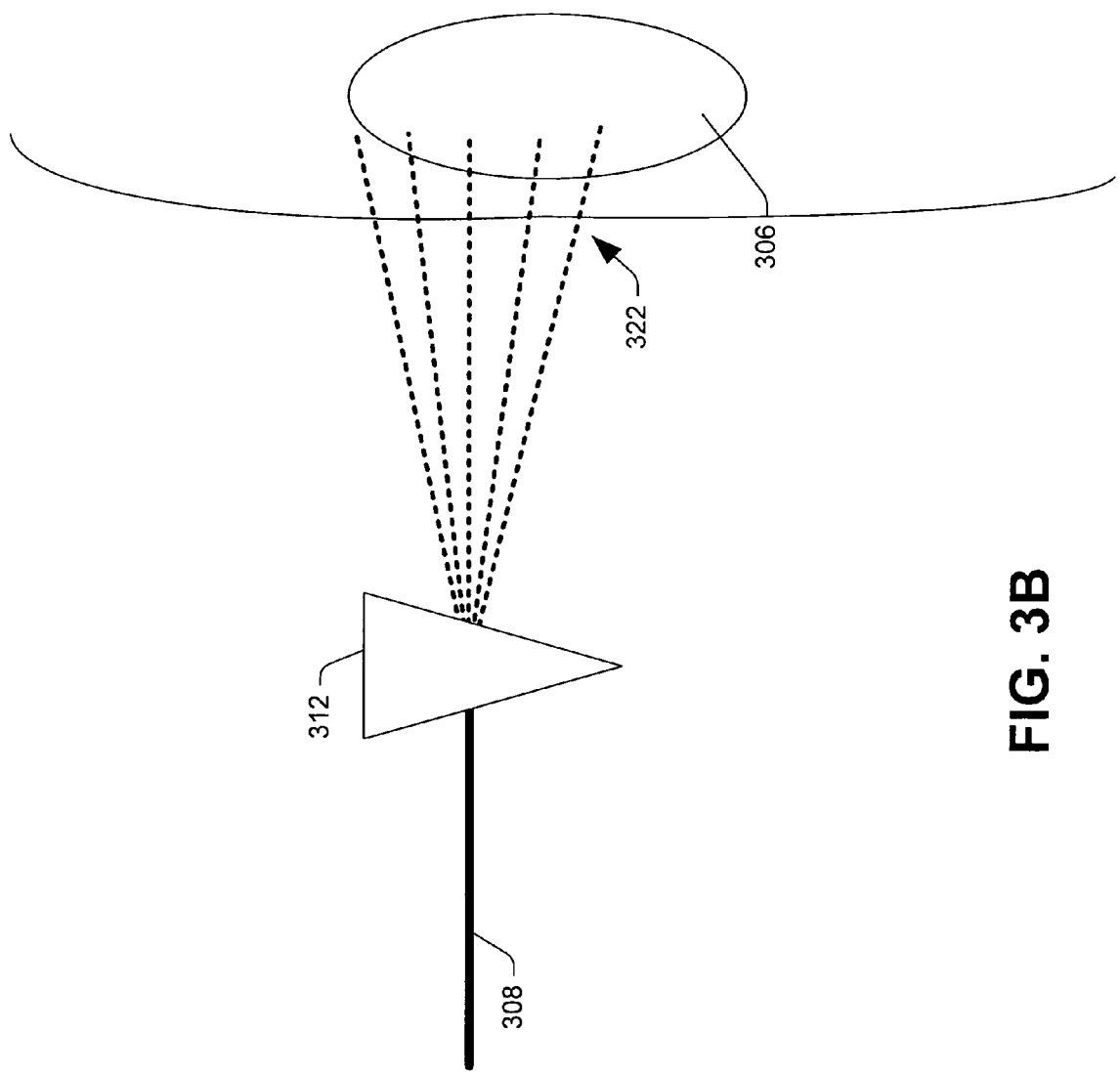
FIG. 3B is a diagram illustrating the single bending element angle adjuster in accordance with an aspect of the present invention.

FIG. 3B is yet another diagram illustrating the single bending element angle adjuster 300 of FIG. 3A in accordance with an aspect of the present invention. The view presented by FIG. 3B is a simplified view intended to further illustrate a range of possible angle adjustments and resulting possible paths for a positions on the target wafer 306. The ion beam 308 is presented with a number of exemplary suitable paths 322 to the positions of the target wafer 306. The bending element 312 alters the path of the ion beam 308 and alters the position at which the ion beam 308 impacts the target wafer 306.

Figure 3C:
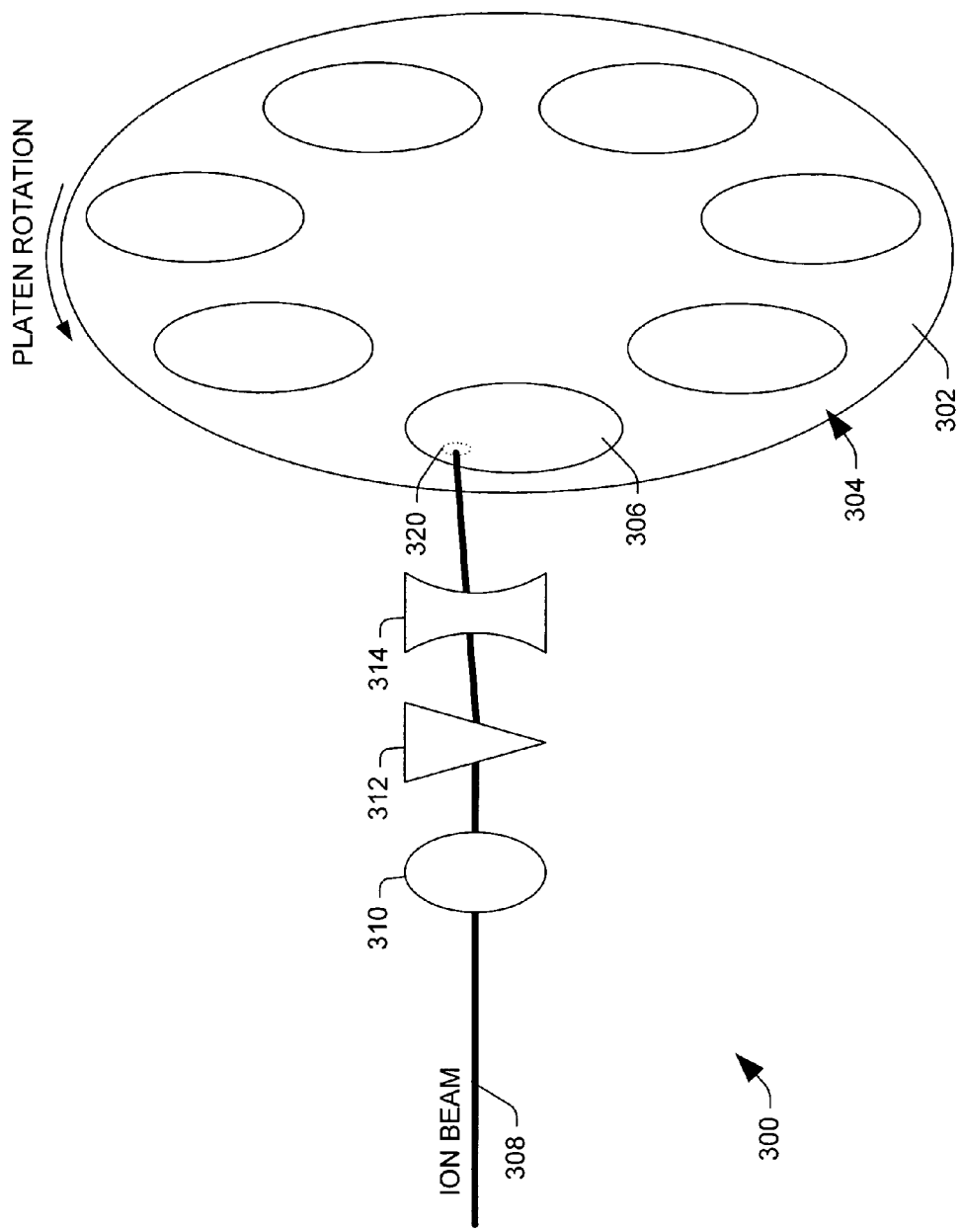
FIG. 3C is another diagram illustrating the single bending element angle adjuster 300 in accordance with an aspect of the present invention.

FIG. 3C is a diagram illustrating a single bending element angle adjuster 300 in accordance with an aspect of the present invention. The angle adjuster 300 is similar to the angle adjuster 300 of FIG. 3A except that focusing elements 310 and 314 have been added to correct for beam size variations as a function of bend angle. The angle adjuster 300 includes the first focusing element 310, the bending element 312, and the second focusing element 314. The first focusing element 310 is operable to controllably focus the ion beam 308, which passes to the bending element 312 and then proceeds to the second focusing element 314, which in turn is also operable to controllably focus the ion beam 308. As a result, the ion beam 308 impacts the target wafer 306 at a selected implant angle at the portion 320 and impacts with a selected shape due to the first and second focusing elements 310 and 312.

Figure 3D:
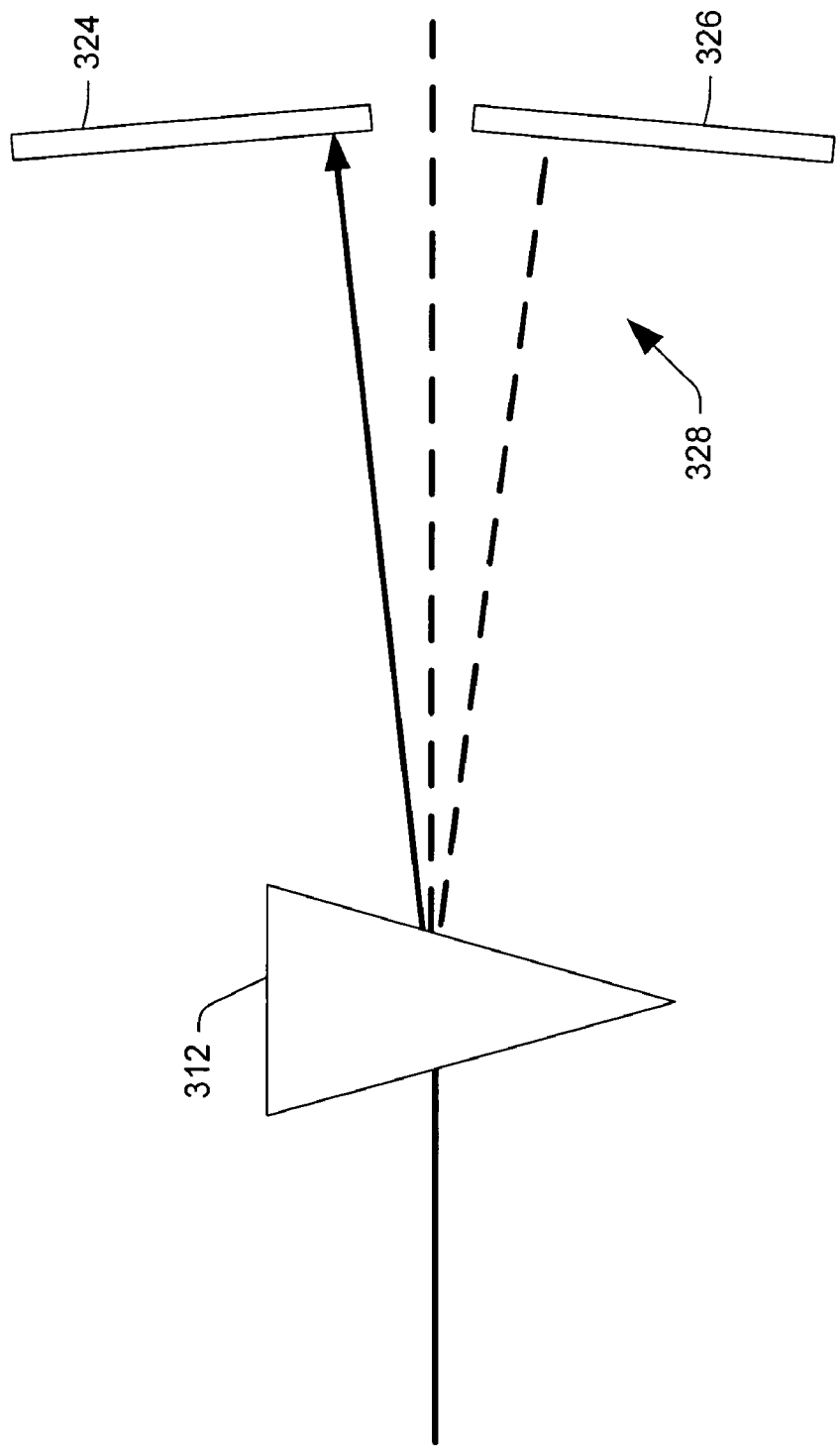
FIG. 3D is yet another diagram illustrating the single bending element angle adjuster 300 in accordance with an aspect of the present invention.

FIG. 3D is another diagram illustrating a top view of the single bending element angle adjuster in accordance with an aspect of the present invention with the corrector working in the fast scan direction. The view presented by FIG. 3D shows the path of the ion beam 308 with respect to adjacent wafers on the disk 302.

The view includes a first target wafer 324 and a second target wafer 326 of the number of target wafers 304. The first target wafer 324 and the second target wafer 326 are adjacent each other and held into place by pads (not shown). A number of possible paths for the ion beam 308 are illustrated at 328. As can be seen in FIG. 3D, adjustments of the implant angle result in adjustments of an implant point or position. The angle adjuster 300 can still cover the entire wafer during ion implantation. A fast scan direction is based on rotation of the disk 302, the speed of which is not typically adjusted during ion implantation. As a result, variations in implant depth and concentration would occur except that the angle adjuster 300 accounts for implant position and initiates ion dosage adjustments in order to compensate.

With only a single bending element the position of the ion beam during ion implantation relative to the spinning disk is changing as the wafer is scanned, which will change the applied dose. The impact on the dose control varies depending on whether the angle adjuster operates in the fast scan or slow scan dimension. In FIG. 3D the deflection is in the fast scan dimension. The angular deflection required to compensate for the cone angle effect simply causes the beam to travel across the disk at a constant velocity. As a result, there is a change in the relative velocity of the beam on the wafer in the fast scan direction. The angle adjuster 300 compensates for this change by adjusting an implant factor or dose. Additionally, the adjustment will vary with slow scan positions to account for a 1/r change, where r is distance from a center of a wafer, in dose with slow scan axis movement. As a result, the adjuster 300 compensates for dose adjustments in response to implant angle adjustments and/or wafer position.

Employment of existing dose control systems to compensate for variations in applied dose due to angle adjustments in the slow scan direction can be prohibitively complex. As a result, there can often exist a tradeoff between angle uniformity and dose uniformity. However, this tradeoff can be avoided by adjusting output of an ion source thereby allowing for angle adjustments and dose adjustments to counter for the variations in applied dose due to the angle adjustments.

FIGS. 3A to 3D serve to illustrate an exemplary single bending element angle adjuster in accordance with the present invention. It is appreciated that variations of the angle adjuster, including additional bending elements and/or focusing elements, are permitted in accordance with the present invention. Furthermore, a dual axis angle adjuster of the present invention is contemplated as including two bending elements that independently adjust a single axis of a path of an ion beam. Additionally, individual bending elements of an angle adjuster in accordance with the present invention can include electric field generation components and/or magnetic field generation components.

Figure 4:
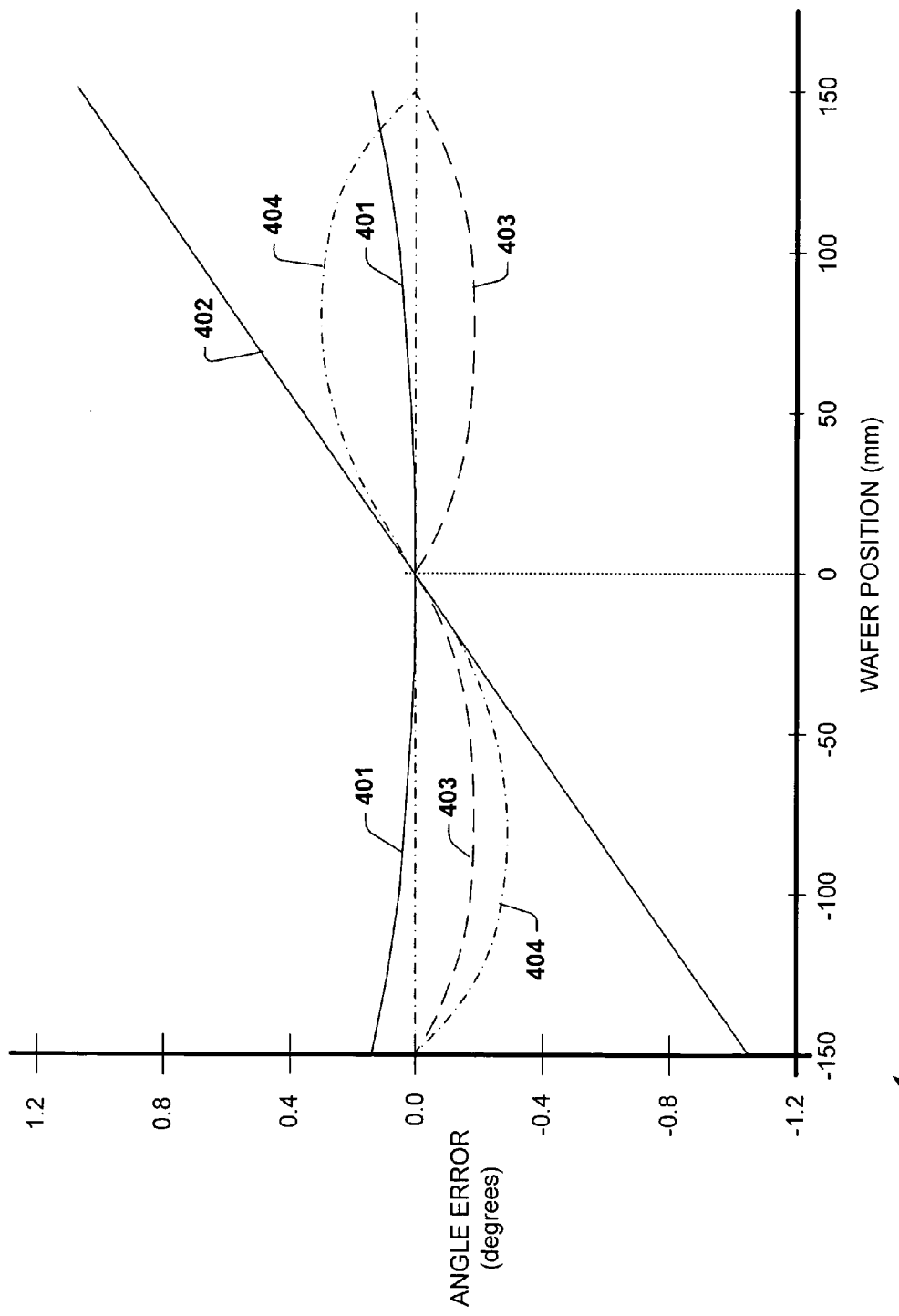
FIG. 4 is a graph illustrating exemplary results of ion implantation angle error before and after correction by an angle adjuster in accordance with an aspect of the present invention.

FIG. 4 is a graph illustrating exemplary results of ion implantation angle error before and after correction by an angle adjuster in accordance with an aspect of the present invention. The angle error is the deviation from a selected or desired implant angle. The graph shows angle error for both fast scan and slow scan directions. The fast scan direction is rotation of wafers on a spinning disk of a batch ion implantation system through an incident ion beam and the slow scan direction is linear movement of the spinning disk. The graph depicts wafer position in millimeters from a center of a target wafer on an x-axis and angle error, as defined above, in degrees on a y-axis. The exemplary results illustrate angle errors in the horizontal diameter (9:00 to 3:00 with a notch at 6:00) and are for a 0 degree implant.

Line 401 illustrates angle error versus wafer position in the slow scan direction without angle correction. It can be seen that the angle error present is relatively modest in the slow scan direction. Line 402 illustrates angle error versus wafer position in the fast scan direction without angle correction. Here, significant angle error is obtained at positions away from the center of the wafer (e.g., about 1.1 degrees at +/−150 millimeters). The angle error for the fast scan direction is substantially a linear relationship, although not exactly linear, based on wafer position, hence the "cone angle effect" demonstrated by the line 402.

Line 403 depicts angle error versus wafer position in the slow scan direction, but with angle correction. The line 403 indicates that the angle error increases, in absolute value terms, until a certain distance and then decreases again to close to zero. The angle error shown by the line 403 is magnified by a factor of 5 in order to be visible in FIG. 4. As a result, the angle error obtained with angle correction, as indicated by the line 403, yields an improvement over the non corrected angle error, indicated by line 401. Line 404, which depicts angle error versus wafer position in the fast scan direction with angle correction, demonstrates substantial improvement in the fast scan direction as compared to the line 402. The angle error shown by the line 404 is magnified by a factor of 100 in order to be visible in FIG. 4. At positions throughout the target wafer, the angle correction yields less angle error than without the angle correction.

The angle error after correction, as depicted by the lines 403 and 404, is a result of waveform(s), examples of which are provided below, employed to control bending elements present within the angle adjuster. It is appreciated that other waveforms can be employed that further reduce the angle error to about zero for the fast scan and slow scan directions. It is again noted that, the angle errors after lines 403 and 404 correction are magnified by 5 and 100, respectively, for illustrative purposes. Otherwise, the lines 403 and 404 would appear to be substantially flat.

Figure 5A:
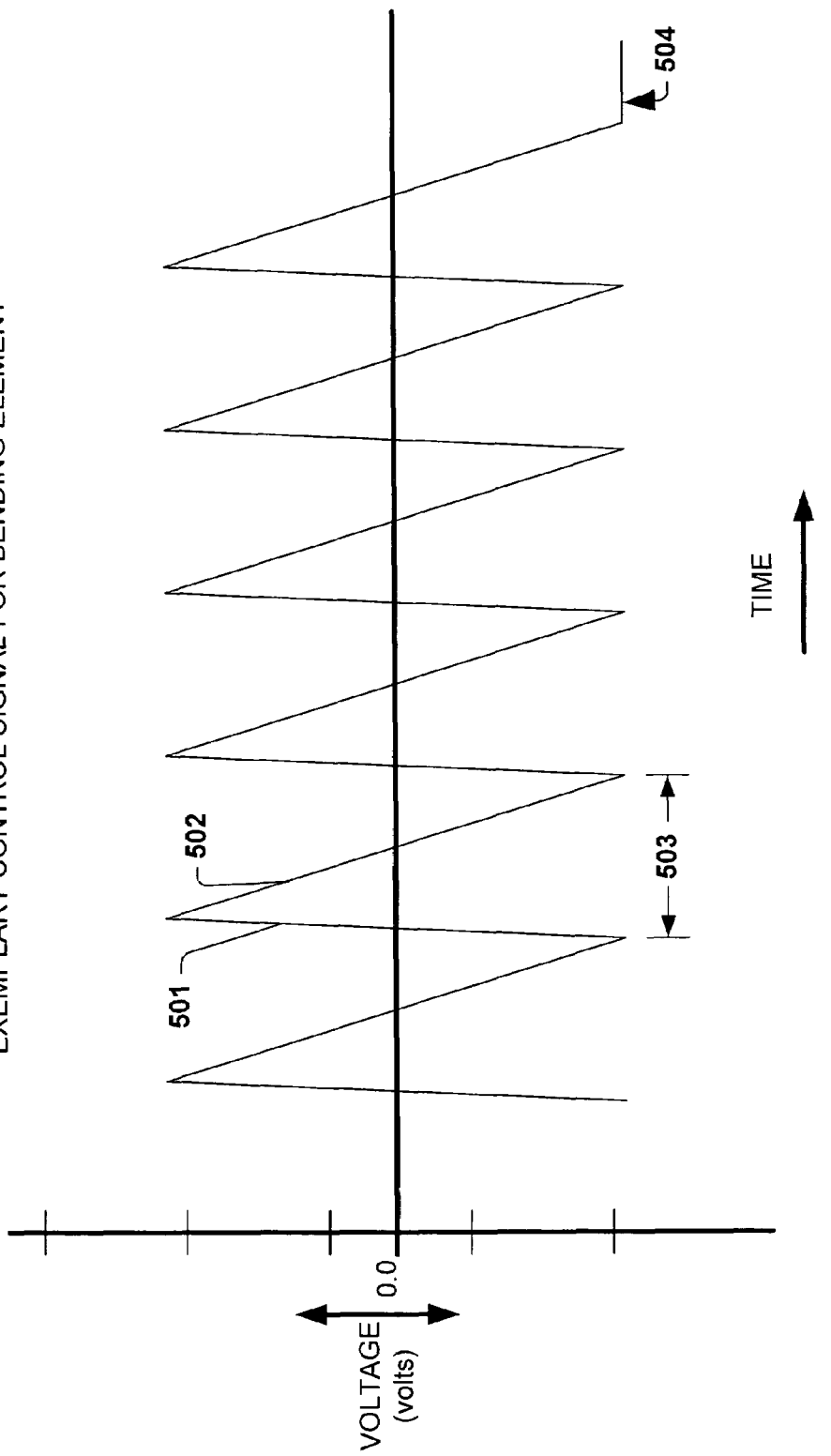
FIG. 5A is a diagram illustrating exemplary control signals for a dual bending element single axis angle adjuster in accordance with an aspect of the present invention.

FIG. 5A is a graph illustrating an exemplary control signal for bending elements of an angle adjuster in accordance with an aspect of the present invention. The diagram shows a sawtooth like waveform 500 employed to control a bending element of the angle adjuster. The waveform 500 is a first order ramp function wherein a transition from maximum to minimum occurs when the ion beam is off the target wafer. Spacing of target wafers on a spinning disk should be sufficient to permit the switch from maximum to minimum while the entire beam is between the wafers. The graph depicts time on an x-axis and voltage on a y-axis and assumes an electric field generating bending element. Alternately, if magnetic bending elements are employed instead of electric bending elements, the y-axis would represent current through the magnet.

The waveform 500 is a ramp signal that repeats for individual wavers 503 on a spinning disk of a batch ion implantation system. A substantially vertical portion 501 of the waveform 500 occurs as an ion beam is targeted between wafers. As a result, sufficient spacing between wafers on the disk is required to permit the change in voltage indicated by the nearly vertical portion 501. A ramp portion 502 occurs substantially as the ion beam is on the wafers. In this instance, the voltage starts at a positive value and decreases until zero, which corresponds to the ion beam target position being a center of a current wafer, and becomes increasingly negative. A flat portion 504 of the waveform 500 is present and occurs when the ion beam is targeted at a virtual slot of the disk and repeats per revolution of the disk. The waveform 500 can be employed to perform the angle corrections illustrated in FIG. 4 to provide the angle corrected line 404 from the uncorrected line 402.

The control signal waveform 500 can be applied to a single bending element as in a single element angle adjuster or multiple bending elements as in a dual bending element angle adjuster. It is appreciated that the waveform 500 is exemplary in nature and that other linear and non-linear waveforms can be employed to control bending elements in accordance with the present invention.

Figure 5B:
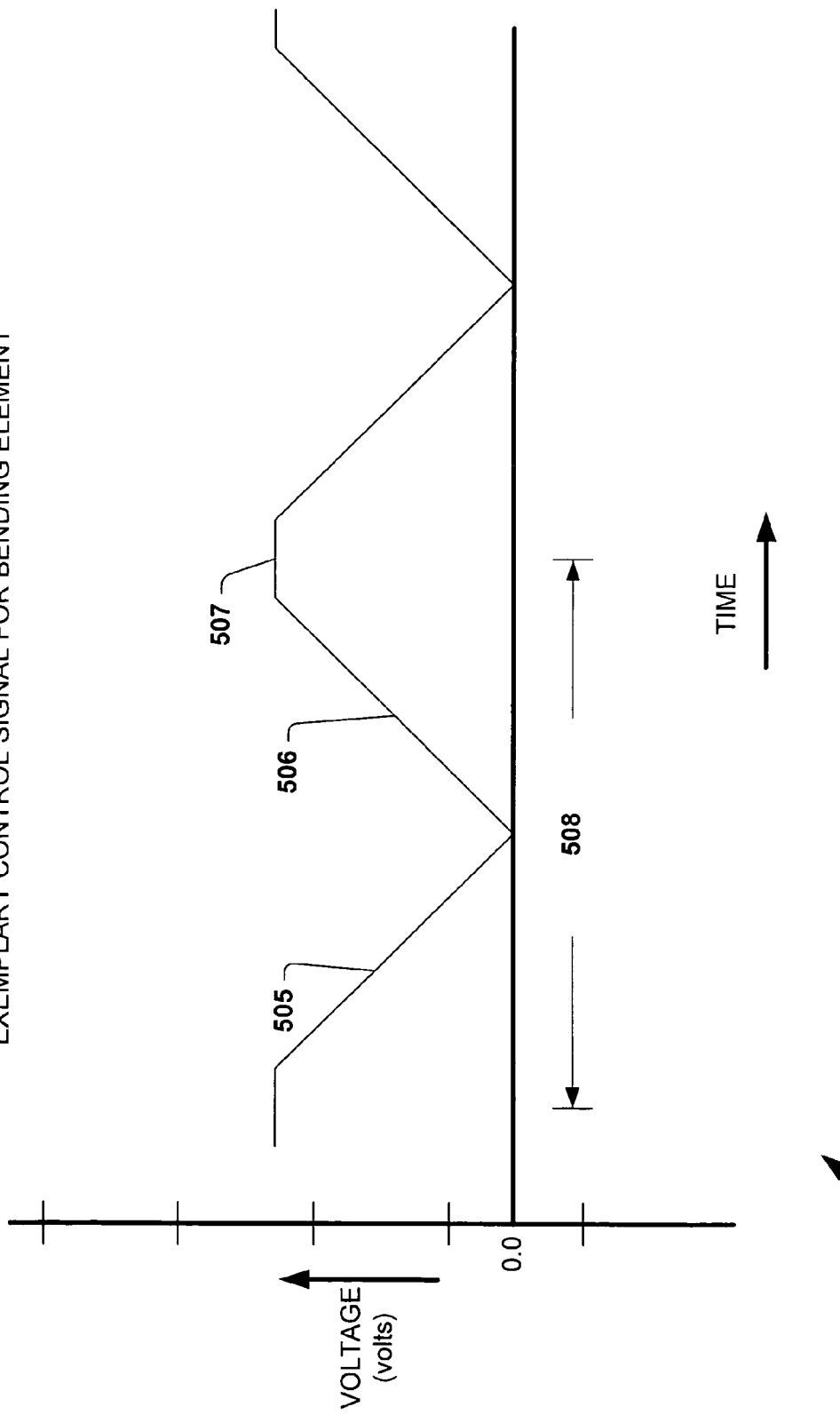
FIG. 5B is another diagram illustrating exemplary control signals for a dual bending element single axis angle adjuster in accordance with an aspect of the present invention.

FIG. 5B is a graph illustrating another exemplary control signal for bending elements of an angle adjuster in accordance with an aspect of the present invention. The diagram shows a waveform 510 employed to control a bending element of the angle adjuster. The waveform 510 includes a down portion 505, an up portion 506, and a flat or constant portion 507. The flat portion 507 occurs between wafers. The graph depicts time on an x-axis and voltage on a y-axis and assumes an electric field generating bending element. Alternately, if magnetic bending elements are employed instead of electric bending elements, the y-axis would represent current through the magnet.

The waveform 510 is a signal that repeats for individual wafers 508 on a spinning disk of a batch ion implantation system. The down portion 505 occurs substantially as an ion beam is targeted on the wafer until the up portion 506 occurs. As the ion beam is targeted between wafers, the flat portion 507 occurs. The waveform 510 can be employed to perform the angle corrections illustrated in FIG. 4 to provide the angle corrected line 403 from the uncorrected line 401.

The control signal waveform 510 can be applied to a single bending element as in a single element angle adjuster or multiple bending elements as in a dual bending element angle adjuster. It is appreciated that the waveform 510 is exemplary in nature and that other linear and non-linear waveforms can be employed to control bending elements in accordance with the present invention.

Figure 6:
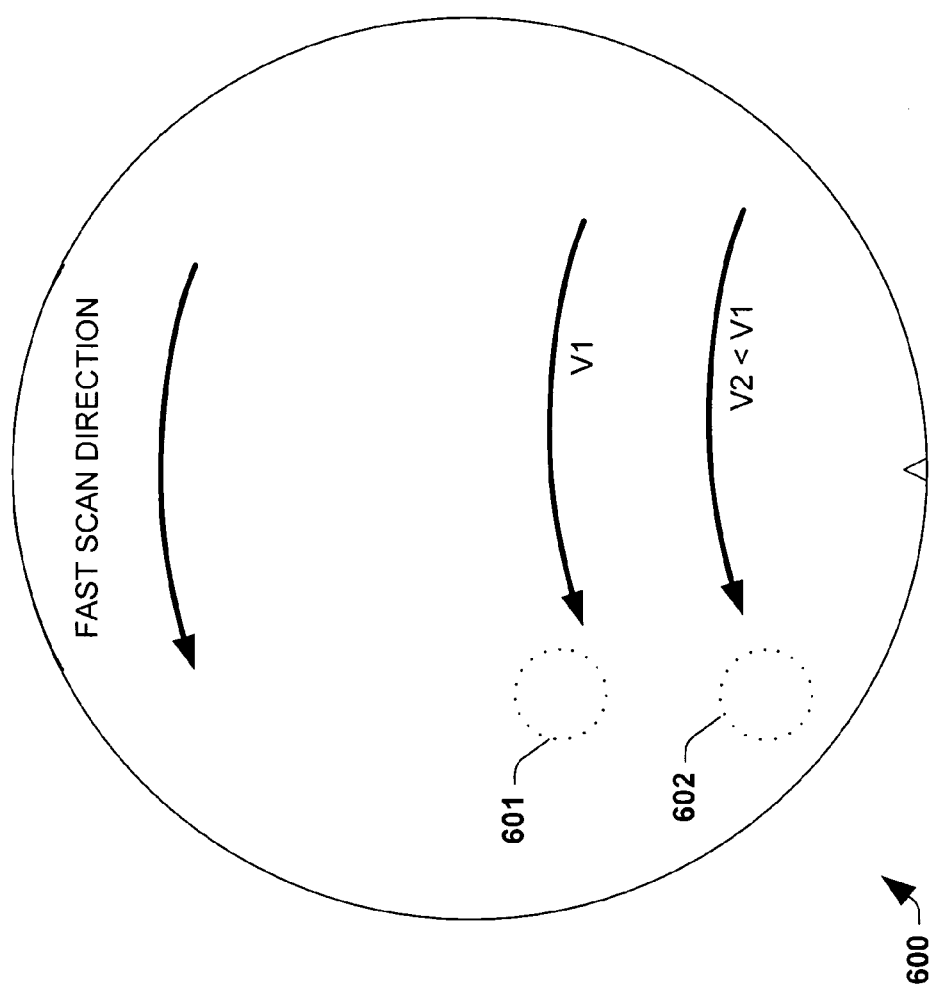
FIG. 6 is a diagram illustrating dosage control for a single bending element single axis angle adjuster in accordance with an aspect of the present invention.

FIG. 6 is a diagram illustrating dosage control for a single bending element adjuster in accordance with an aspect of the present invention. The diagram illustrates a wafer 600 on a disk of a batch ion implanter, wherein the disk is being rotated in a fast scan direction. Additionally, a first target portion 601 on the wafer 600 and a second target portion 602 on the wafer are shown indicating different target locations for an ion beam.

Disk rotation exposes the wafer 600 to the incoming ion beam in circular arcs in a fast scan direction while a single bending element adjuster moves the ion beam in a straight line. Over a short distance, the circular arcs can be approximated as a straight line, and in the short distance an applied dose can be maintained within control limits by varying the y-scan speed alone. Further refinements to keep the applied dose within control limits include, for example, employing a dual bending element single axis angle adjuster instead of the single element single axis adjuster and varying ion source output as a function of wafer rotation.

A velocity of the first target position 601 with respect to the ion beam is equal to V1 and a velocity of the second target position 602 with respect to the ion beam is equal to V2. The first target position 601 is a greater distance from a center point of the rotating disk, and, as a result, the velocity of the second target position 602 V2 is less than the velocity of the first target position 601 V1. As a result, dose correction at the second target position 602 is different than the dose correction at the first target position 601. The nominal slow-scan velocity at the first target position 601 should be lower than at the second target position 602 to compensate for the different velocities. When the angle corrector is in operation the slow scan velocity is adjusted to keep the total beam exposure the same at spots 601 & 602.

Figure 7:
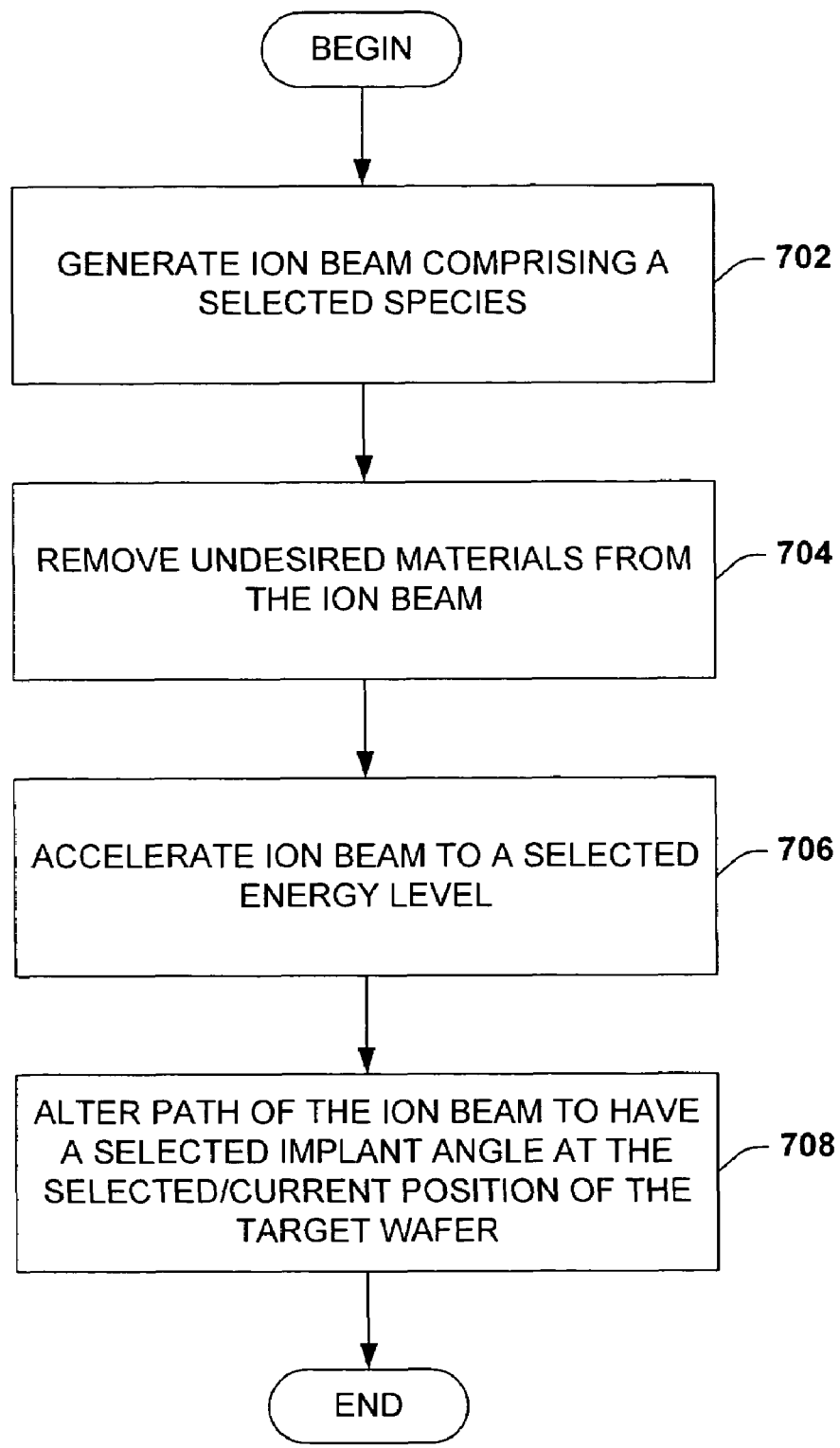
FIG. 7 is a flow diagram illustrating a method of operating an ion implantation system with an adjuster in accordance with an aspect of the present invention.
Figure 8:
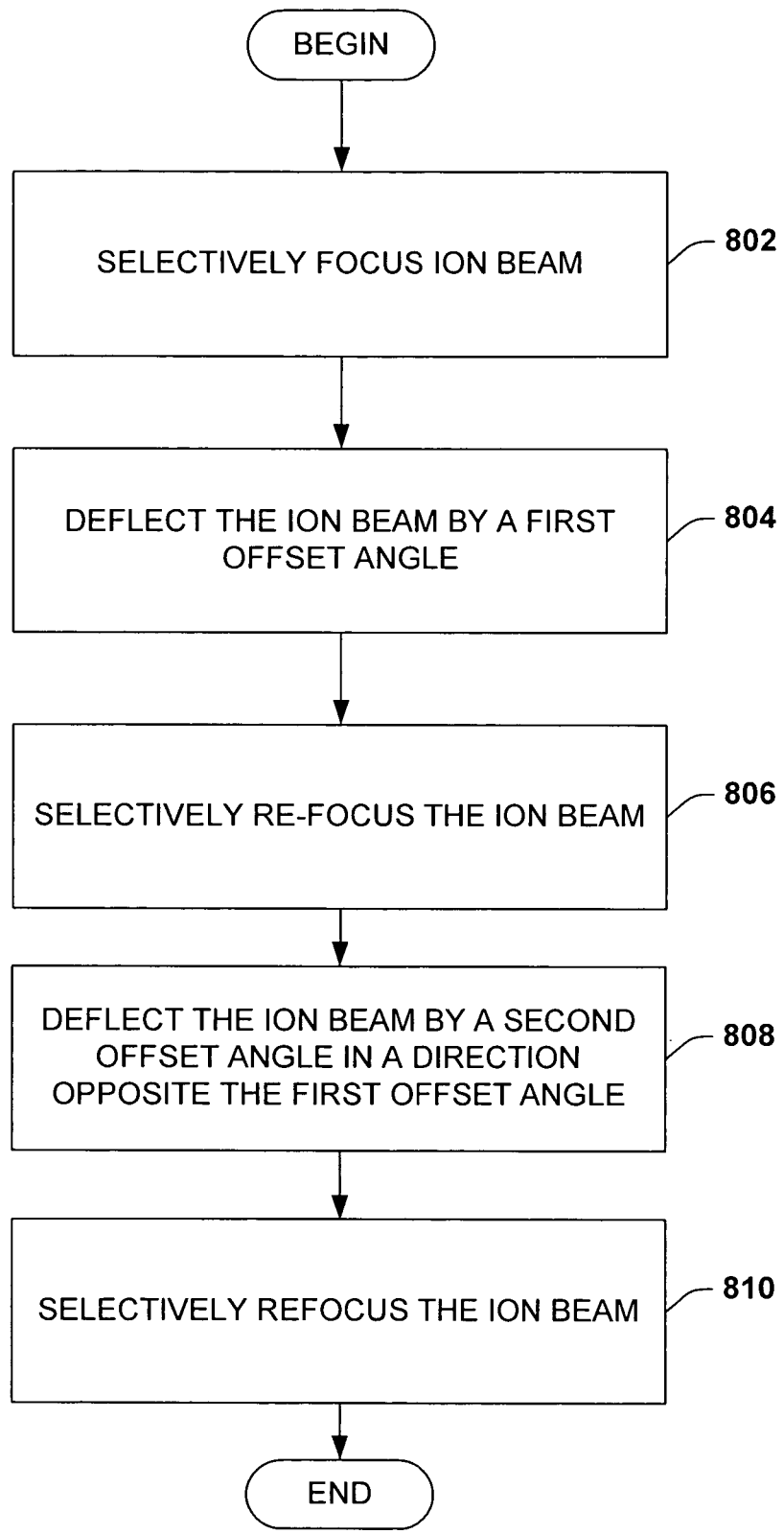
FIG. 8 is a flow diagram illustrating a method of operating a dual bending element angle adjuster in accordance with an aspect of the present invention.
Figure 9:
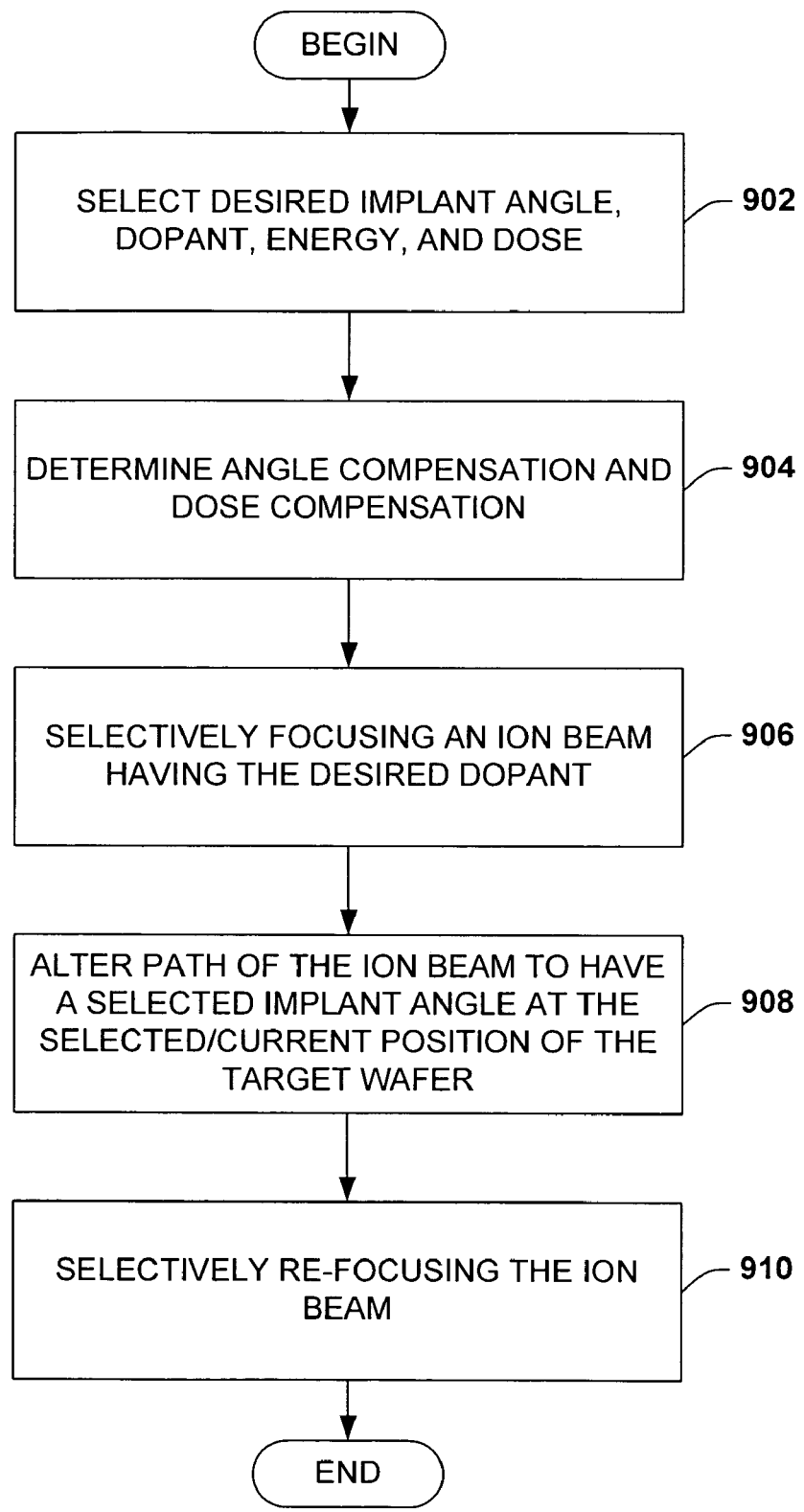
FIG. 9 is a flow diagram illustrating a method of operating a single bending element angle adjuster in accordance with an aspect of the present invention.

In view of the foregoing structural and functional features described supra, methodologies in accordance with various aspects of the present invention will be better appreciated with reference to the above figures. While, for purposes of simplicity of explanation, the methodologies of FIGS. 7, 8, and 9 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 7 is a flow diagram illustrating a method 700 of operating an ion implantation system with an adjuster in accordance with an aspect of the present invention. The method 700 employs the angle adjuster to compensate for "cone angle effect" variations thereby providing a substantially uniform implantation angle during ion implantation. The method 700 operates on batch processing ion implantation systems that include a spinning disk that holds a number of wafers or workpieces.

The method 700 is employed to perform an ion implantation process at a desired implant angle, dopant, energy, and dose for a target wafer. The desired implant angle, the dopant, the energy, and the dose can vary according to specific semiconductor devices being fabricated on the target wafer. The desired dopant is p-type or n-type and the desired energy generally relates to how deep the dopant is implanted. The desired dose relates to a resulting dopant concentration of the desired dopant in the wafer.

The method begins at block 702, wherein an ion beam comprising a selected species is generated. The selected species is either n-type or p-type. Examples of suitable p-type species for silicon include boron (B), gallium (Ga) or indium (In). Examples of suitable n-type species for silicon include arsenic (As), phosphor (P), and antimony (Sb). It is noted that the present invention includes other types of dopants/species for other types of semiconductor materials.

At block 704, undesired materials are removed from the ion beam by employing a mass analyzer. The mass analyzer includes a mass analyzing magnet that causes only those ions having an appropriate mass to charge ratio to pass through the mass analyzer. In addition to the desired species of ions, produced ions typically include a proportion of ions having other than the proper atomic mass. Ions having an atomic mass above or below the proper atomic mass are not suitable for implantation. The magnetic field generated by the mass analyzing magnet causes the ions to move in a curved trajectory. The magnetic field, established by mass analyzer control electronics, is such that only ions having an atomic mass equal to the atomic mass of the desired ion species traverse the curved beam path through the mass analyzer.

The ion beam is then accelerated or decelerated to a selected energy level at block 706 toward a selected position on a target wafer. Typically, a linear accelerator is employed to provide an electric or magnetic filed that increases or decreases velocity of ions or species within the ion beam. However, variations of the method 700 also include not utilizing a linear accelerator and/or not accelerating or decelerating the ion beam by a linear accelerator.

Focusing elements can also be present and employed to mitigate divergence of the ion beam.

Subsequently, a path of the ion beam is altered by an angle adjuster at block 708 to have a selected implant angle at the selected position of the target wafer, which is one of a number of target wafers on a spinning disk. The path can be altered in one or two dimensions. Additionally, a suitable number of bending elements are incorporated into the angle adjuster in order to accomplish the selected implant angle. For example, one or two bending elements can be employed, as described above, in order to alter the path of the ion beam in one axis (e.g., a fast scan axis). For another example, two or more bending elements can be employed, as described above, in order to alter the path of the ion beam in two axes (e.g., a fast scan axis and a slow scan axis).

The method 700 repeats continuously while the spinning disk rotates the target wafers through the ion beam in a fast scan direction and while the spinning disk is moved by linear motion in a slow scan direction such that all of the target wafers are substantially uniformly implanted with the selected species. The rotational and linear motion is further described with respect to FIG. 1A. The selected position at which the ion beam is directed in the method 700 varies according to the rotational and linear motion.

FIG. 8 is a flow diagram illustrating a method 800 of operating a dual bending element angle adjuster in accordance with an aspect of the present invention. The method 800 employs the angle adjuster to compensate for "cone angle effect" variations typically present in batch ion implantation systems. As a result of the angle adjustments, a substantially uniform implantation angle can be achieved across entire wafers during ion implantation. The method 800 operates for batch processing ion implantation systems that include a spinning disk that holds a number of wafers or workpieces.

The method begins at block 802 where an ion beam is selectively focused, typically by a first focusing element. The ion beam comprises a selected species or ions that are n-type or p-type. The beam can be selectively focused in order to mitigate divergence of the ion beam. Continuing, the ion beam is then deflected by a first offset angle in a first direction of a single axis at block 804. A first bending element is generally employed to perform the deflection. The first offset angle is determined at least partially according to a current target position on a wafer and a desired or selected implant angle. Subsequently, the ion beam is again selectively focused at block 806. A second focusing element is employed to mitigate divergence of the ion beam.

Then, the ion beam is deflected by a second offset angle in a second direction of the single axis at block 808, where the second direction is opposite that of the first direction. A second bending element is typically employed to perform the second deflection. The second offset angle is selected at least partially according to the current target position on a wafer, the first offset angle, and a desired or selected implant angle. The ion beam is then selectively focused at block 810, typically by a third focusing element, and, as a result, the ion beam continues toward the target position at the selected implant angle with respect to the wafer.

It is appreciated that the present invention includes variations of the method 800 in which the ion beam is again deflected one or more times by additional offset angles prior to reaching the target position. Additionally, the present invention includes variations of the method 800 in which additional focusing blocks are performed.

FIG. 9 is a flow diagram illustrating a method 900 of operating a single bending element angle adjuster in accordance with an aspect of the present invention. The method 900 employs the angle adjuster to compensate for "cone angle effect" variations typically present in batch ion implantation systems. As a result of the angle adjustments, a substantially uniform implantation angle can be achieved across entire wafers during ion implantation. The method 900 operates for batch processing ion implantation systems that include a spinning disk that holds a number of wafers or workpieces.

The method 900 begins at block 902, where a desired implant angle, dopant, energy, and dose for a target wafer are selected for an implant process. The target wafer is one of a number of wafers located on a spinning disk of a batch ion implantation system. The desired implant angle, the dopant, the energy, and the dose can vary according to specific semiconductor devices being fabricated on the target wafer. The desired dopant is p-type or n-type. The desired energy generally relates to how deep the dopant is implanted. The desired dose relates to a dopant concentration of the desired dopant in the wafer.

Continuing with the method 900, an angle compensation and a dose compensation are determined for a selected or current position of the target wafer at block 904. The angle compensation is determined according to the current position and the dose compensation is determined according to the angle compensation and the current position.

An ion beam having the desired dopant, energy, and compensated dose is received at a first focusing element that focuses the ion beam in order to mitigate divergence of the desired dopant present within the beam at block 906. Then, the ion beam is deflected according to the angle compensation by a bending element at block 908 toward the current position of the target wafer. Subsequently, the ion beam is again focused to mitigate divergence of the ion beam by a second focusing element at block 910 and the ion beam continues to the target position on the wafer.

It is appreciated that the method 900 is repeatable for other positions of the wafer, as well as other wafers on the spinning disk, such that the entire wafers can be selectively implanted with the desired dopant.

Although the invention has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A batch ion implantation system comprising:
    an ion source that controllably generates an ion beam containing a selected species;
    a beamline assembly that processes the ion beam from the ion source;
    an angle adjuster that selectively alters a path of the ion beam according to a current target position and a selected implant angle; and
    an end station comprising a spinning disk that rotates about an axis non-parallel to the path of the ion beam and is movable in a linear direction and pads affixed to an outer edge of the spinning disk that hold target wafers at an offset angle.

2. The system of claim 1, wherein the current target position is a distance from a center of a current wafer of the target wafers.

3. The system of claim 1, wherein the beamline assembly comprises a mass analyzer that selectively removes undesired particles from the ion beam and a linear accelerator that selectively accelerates particles within the ion beam to a selected energy level.

4. The system of claim 1, wherein the end station further comprises a linear motor that controllably moves the target wafers in the linear direction.

5. The system of claim 1, wherein the angle adjuster comprises a first bending element and a second bending element, wherein the first bending element alters the path of the ion beam by a first offset angle in a first direction and the second bending element alters the path of the ion beam from the first bending element by a second offset angle in a second direction, wherein the second direction is opposite the first direction.

6. The system of claim 5, wherein the first bending element generates an electric field across the path of the ion beam to alter the path of the ion beam.

7. The system of claim 5, wherein the first and second bending elements generate magnetic fields across the path of the ion beam.

8. The system of claim 5, further comprising an angle element controller that obtains the current target position from the end station, generates a first control signal according to the current target position, generates a second control signal according to the current target position, applies the first control signal to the first bending element, and applies the second control signal to the second bending element.

9. The system of claim 1, wherein the angle adjuster comprises a bending element that alters the path of the ion beam by an offset angle.

10. The system of claim 9, further comprising a dose control component that controls the ion source and adjusts a dose for the ion beam generated by the ion source as a function of wafer rotation.

11. The system of claim 9, further comprising a dose control component that adjusts movement of the end station in the linear direction to keep an applied dose within acceptable limits.

12. An angle adjuster for a batch ion implantation system comprising:
 a first bending element that receives an ion beam and alters the path of the ion beam by a first offset angle in a first direction;
 a second bending element that receives the ion beam from the first bending element and alters the path of the ion beam by a second offset angle in a second direction, wherein the second direction is opposite the first direction; and
 an angle adjuster controller coupled to the first bending element and the second bending element that selects the first offset angle and the second offset angle according to a desired implant angle and a current target position.

13. The angle adjuster of claim 12, wherein the angle adjuster further generates control signals received by the first bending element and the second bending element in order to control their operation.

14. The angle adjuster of claim 12, wherein the first bending element is comprised of a pair of plates across which an electric field is generated.

15. The angle adjuster of claim 12, wherein the first bending element is comprised of a pair of plates across which a magnetic field is generated.

16. The angle adjuster of claim 12, further comprising a focusing element that receives the ion beam, focuses the ion beam, and directs the ion beam towards the first bending element.

17. The angle adjuster of claim 12, wherein the first bending element is further operable to selectively focus the ion beam.

18. An angle adjuster for a batch ion implantation system comprising:
 a bending element that receives an ion beam and alters the path of the ion beam by an offset angle in a single axis;
 an angle adjuster controller coupled to the bending element that selects the offset angle according to a desired implant angle and a current target position; and
 an ion source that generates the ion beam.

19. The angle adjuster of claim 18, wherein the bending element is comprised of a pair of plates across which an electric field is generated.

20. The angle adjuster of claim 18, wherein the bending element is comprised of a pair of plates across which a magnetic field is generated.

21. The angle adjuster of claim 18, wherein the bending element is further operable to selectively focus the ion beam.

22. A method of performing ion implantation comprising:
 generating an ion beam comprising a selected species;
 selectively removing undesired materials from the generated ion beam;
 accelerating the ion beam to a selected energy level; and
 altering a path of the ion beam according to a desired implant angle and a current target position.

23. The method of claim 22, further comprising implanting the selected species at the target position and at the desired implant angle.

24. The method of claim 22, wherein altering the path of the ion beam comprises altering the path of the ion beam by an offset angle to compensate for angular error at the current target position.

25. The method of claim 24, further comprising determining the offset angle according to the desired implant angle and the current target position.

26. A method of performing ion implantation comprising:
 generating an ion beam comprising a selected species; and
 altering a path of the ion beam according to a desired implant angle to compensate for angular errors and a current target position.

27. The method of claim 26, wherein altering the path of the ion beam comprises:
 deflecting the ion beam by a first offset angle in a first direction; and
 deflecting the ion beam by a second offset angle in a second direction, wherein the second direction is opposite the first direction.

28. The method of claim 27, wherein altering the path of the ion beam further comprises selectively focusing the ion beam before deflecting the ion beam by the first offset angle, selectively focusing the ion beam before deflecting the ion beam by the second offset angle, and selectively focusing the ion beam after deflecting the ion beam by the second offset angle.

29. The method of claim 27, further comprising determining the first offset angle and the second offset angle according to the current target position and the desired implant angle.

30. The method of claim 26, wherein altering the path of the ion beam comprises altering the path of the ion beam by an offset angle to compensate for angular error at the current target position and determining the offset angle according to the desired implant angle and the current target position.

31. The method of claim 26, further comprising selectively focusing the ion beam.

* * * * *